United States Patent
Dewey et al.

(10) Patent No.: US 10,340,374 B2
(45) Date of Patent: Jul. 2, 2019

(54) HIGH MOBILITY FIELD EFFECT TRANSISTORS WITH A RETROGRADED SEMICONDUCTOR SOURCE/DRAIN

(71) Applicant: Intel Corporation, Santa Clara, CA (US)

(72) Inventors: Gilbert Dewey, Hillsboro, OR (US); Willy Rachmady, Beaverton, OR (US); Matthew V. Metz, Portland, OR (US); Chandra S. Mohapatra, Beaverton, OR (US); Sean T. Ma, Portland, OR (US); Jack T. Kavalieros, Portland, OR (US); Anand S. Murthy, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/755,450

(22) PCT Filed: Sep. 25, 2015

(86) PCT No.: PCT/US2015/052345
§ 371 (c)(1),
(2) Date: Feb. 26, 2018

(87) PCT Pub. No.: WO2017/052619
PCT Pub. Date: Mar. 30, 2017

(65) Prior Publication Data
US 2018/0261694 A1    Sep. 13, 2018

(51) Int. Cl.
*H01L 29/66* (2006.01)
*H01L 29/778* (2006.01)
(Continued)

(52) U.S. Cl.
CPC ............ *H01L 29/778* (2013.01); *B82Y 10/00* (2013.01); *H01L 21/8258* (2013.01);
(Continued)

(58) Field of Classification Search
None
See application file for complete search history.

(56) References Cited

U.S. PATENT DOCUMENTS 8,264,032 B2   9/2012   Yeh
8,674,341 B2   3/2014   Ko
(Continued)

OTHER PUBLICATIONS

International Preliminary Report on Patantability for International Patent Application No. PCT/US15/52345, dated Apr. 5, 2018.
(Continued)

*Primary Examiner* — Dung A. Le
(74) *Attorney, Agent, or Firm* — Green, Howard & Mughal LLP

(57) ABSTRACT

Monolithic FETs including a channel region of a first semiconductor material disposed over a substrate. While a mask, such as a gate stack or sacrificial gate stack, is covering the channel region, an impurity-doped compositionally graded semiconductor is grown, for example on at least a drain end of the channel region to introduce a carrier-blocking conduction band offset and/or a wider band gap within the drain region of the transistor. In some embodiments, the compositional grade induces a carrier-blocking band offset of at least 0.25 eV. The wider band gap and/or band offset contributes to a reduced gate induced drain leakage (GIDL). The impurity-doped semiconductor may be compositionally graded back down from the retrograded composition to a suitably narrow band gap material providing good ohmic contact. In some embodiments, the impurity-doped compositionally graded semiconductor
(Continued)

growth is integrated into a gate-last, source/drain regrowth finFET fabrication process.

13 Claims, 11 Drawing Sheets

(51) Int. Cl.
- H01L 29/775 (2006.01)
- H01L 29/201 (2006.01)
- H01L 21/8238 (2006.01)
- H01L 21/8258 (2006.01)
- H01L 27/092 (2006.01)
- H01L 29/10 (2006.01)
- H01L 29/205 (2006.01)
- H01L 29/423 (2006.01)
- H01L 29/78 (2006.01)
- B82Y 10/00 (2011.01)
- H01L 29/06 (2006.01)

(52) U.S. Cl.
CPC .. *H01L 21/823821* (2013.01); *H01L 27/0924* (2013.01); *H01L 29/1033* (2013.01); *H01L 29/201* (2013.01); *H01L 29/205* (2013.01); *H01L 29/42356* (2013.01); *H01L 29/42392* (2013.01); *H01L 29/66462* (2013.01); *H01L 29/66469* (2013.01); *H01L 29/66795* (2013.01); *H01L 29/775* (2013.01); *H01L 29/785* (2013.01); H01L 21/823807 (2013.01); H01L 29/0673 (2013.01)

(56) References Cited

U.S. PATENT DOCUMENTS

| | | | |
|---|---|---|---|
| 9,653,580 | B2 | 5/2017 | Balakrishnan et al. |
| 2002/0185679 | A1 | 12/2002 | Baliga et al. |
| 2004/0211955 | A1 | 10/2004 | Hsu et al. |
| 2005/0093033 | A1 | 5/2005 | Kinoshita et al. |
| 2009/0108350 | A1 | 4/2009 | Cai et al. |
| 2010/0025771 | A1* | 2/2010 | Hoentschel ....... H01L 21/26506 257/369 |
| 2010/0148153 | A1 | 6/2010 | Hudait et al. |
| 2010/0163847 | A1 | 7/2010 | Majhi |
| 2010/0193840 | A1 | 8/2010 | Doyle |
| 2010/0252862 | A1 | 10/2010 | Ko |
| 2011/0133292 | A1 | 6/2011 | Lee |
| 2012/0007183 | A1 | 1/2012 | Chang et al. |
| 2012/0139047 | A1 | 6/2012 | Luo |
| 2012/0248502 | A1 | 10/2012 | Cheng |
| 2013/0056795 | A1 | 3/2013 | Wu et al. |
| 2013/0113051 | A1* | 5/2013 | Cai .................. H01L 21/26586 257/402 |
| 2013/0134488 | A1 | 5/2013 | Fumitake |
| 2014/0070276 | A1 | 3/2014 | Ko et al. |
| 2014/0175515 | A1 | 6/2014 | Then |
| 2014/0374841 | A1 | 12/2014 | Wang et al. |
| 2015/0093868 | A1 | 4/2015 | Obradovic et al. |
| 2015/0243756 | A1 | 8/2015 | Obradovic et al. |
| 2015/0255456 | A1 | 9/2015 | Jacob et al. |
| 2015/0263138 | A1 | 9/2015 | Kim |
| 2015/0263159 | A1* | 9/2015 | Ching .................. H01L 29/785 257/77 |
| 2016/0043188 | A1* | 2/2016 | Chu .................... H01L 27/124 257/72 |
| 2017/0047404 | A1 | 2/2017 | Bentley et al. |
| 2018/0254332 | A1 | 9/2018 | Mohapatra et al. |

OTHER PUBLICATIONS

Ayers, J.E. "Epitaxy", <http://engr.uconn.edu/~jayers/epitaxy.htm>, online Jun. 15, 2015, 16 pgs.

Huang, C-Y, "III-V Ultra-Thin-Body InGaAs/InAs MOSFETs for Low Standby Power Logic Applications", University of California Santa Barbara, Doctoral Thesis, Sep. 2015, pp. 1-167.

Nahory, R.E., "Band gap versus composition and demonstration of Vegard's law for In1-xGaxAsyP1-y lattice matched to LnP", App. Phys. Lett. 33(7), pp. 659-661, Oct. 1978.

Nahory, R.E., "Energy-Gap Values for InxGA1-xAs at 300k", The Semiconductors—Information Web-Site, <hhtps://www.semiconductors.co.uk/eg(ingaas).html>, 4 pgs.

Porod, W., "Modification of the virtual-crystal approximation for ternary III-V compounds", Phys. Rev., B27, No. 4, pp. 2587-2589, Feb. 1983.

International search Report and Written Opinion for International Patent Application No. PCT/US2015/052299, dated Jun. 15, 2016.

International Search Report and Written Opinion for International Patent Application No. PCT/US2015/052345, dated Jun. 20, 2016.

International Search Report and Written Opinion, dated Jun. 15, 2016 for PCT Patent No. PCT/US15/52302.

International Search Report and Written Opinion from PCT/US2015/052342 dated Jun. 15, 2016, 9 pgs.

* cited by examiner

HIGH MOBILITY FIELD EFFECT TRANSISTORS WITH A RETROGRADED SEMICONDUCTOR SOURCE/DRAIN

CLAIM OF PRIORITY

This Application is a National Stage Entry of, and claims priority to, PCT Application No. PCT/US15/52345, filed on 25 Sep. 2015 and titled "HIGH MOBILITY FIELD EFFECT TRANSISTORS WITH A RETROGRADED SEMICONDUCTOR SOURCE/DRAIN", which is incorporated by reference in its entirety for all purposes.

BACKGROUND

Efforts to extend Moore's law for integrated circuitry (IC) have included development of transistors employing materials other than silicon, such as III-V compound semiconductor materials (e.g., InP, InGaAs, InAs). These high mobility material systems typically display higher carrier mobility than silicon devices, and so their introduction has long been suggested as path toward faster transistors. However, along with higher carrier mobility, in a field effect transistor (FET) the off-state ($I_{off}$) leakage between source and drain can be significantly higher than for a silicon-based FET of equal effective (electrical) channel length. At high off-state drain to gate biases, band-to-band tunneling between the drain and gate insulator may cause Gate Induced Drain Leakage (GIDL) current. In a silicon-based FET, subthreshold leakage is typically much larger than GIDL current. However, with smaller III-V band gap semiconductors in the gated channel, GIDL current can contribute significantly to $I_{off}$.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
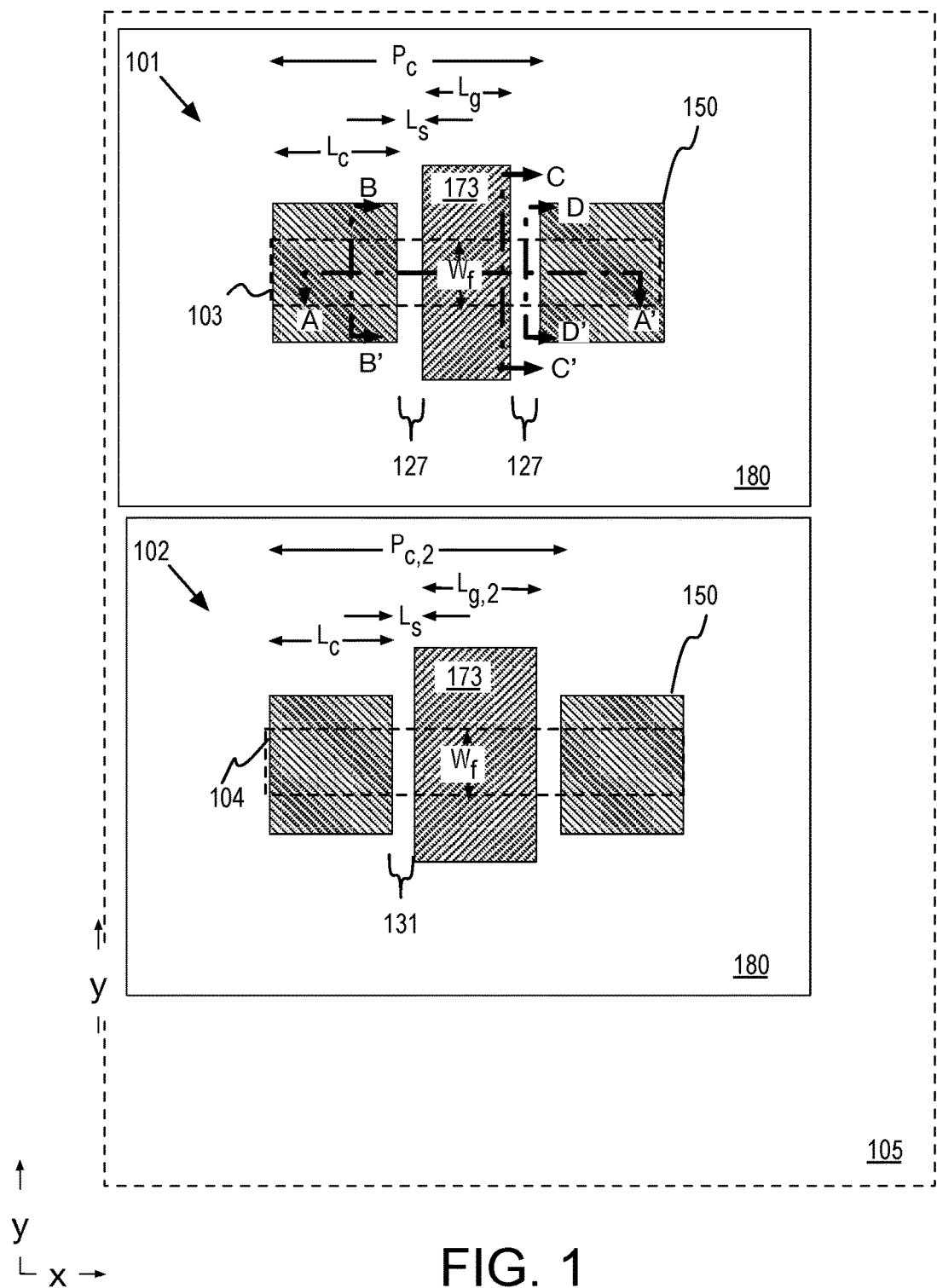
FIG. 1 is a plan view of a high mobility finFET and a silicon finFET disposed over adjacent regions of a substrate, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

In embodiments described further below, a first semiconductor material is employed for a transistor channel region. For such a channel material, carrier mobility may be higher and band gap lower than that of silicon. Off-state leakage may also be more significant than for a reference silicon FET of a similar channel length. Techniques and transistor architectures to reduce off-state leakage for a given channel length are an important aspect of employing high mobility semiconductor material systems to extend Moore's law. Rather than simply achieving higher individual transistor performance (e.g., high Ft), achieving reductions in off-state leakage enable further lateral scaling, and greater transistor density. In some embodiments described herein, a wide band gap material is included in an impurity-doped raised source/drain semiconductor to limit transistor leakage current for a desired channel length. In some such embodiments, the channel material is a binary or ternary III-V alloy and an impurity doped ternary or quaternary III-V alloy is compositionally graded at least on a drain side of the channel region to block and/or otherwise reduce GIDL current. In some advantageous embodiments, the compositionally graded source/drain semiconductor is leveraged to reduce an area of the transistor cell, for example by reducing the length of the channel region between the source and drain regions, or enabling greater overlap between gate electrode and the source/drain regions without inducing transistor leakage characteristics significantly worse than that of a reference silicon-channeled device.

In some embodiments described further below, monolithic FETs include a channel of a first III-V semiconductor material disposed over a substrate. A gate electrode is disposed over the channel region. A pair of semiconductor source/drain regions interfacing with the channel region include a thickness of a graded alloy of another semiconductor material. In exemplary embodiments, the graded composition of the impurity-doped semiconductor begins at a first alloy composition proximal to an interface of the channel region and reaches a second alloy composition a first distance from the interface. The graded composition is associated with a charge carrier-blocking band offset. Hence, for an n-type transistor, the second alloy composition has at least a conduction band offset (CBO) from the first alloy composition attributable to the material have a smaller electron affinity (i.e., higher conduction band energy) than the channel semiconductor material. A smooth linear grading may be employed to minimize the electron-tunneling barrier in the source junction and thus, maintain a low access resistance.

In some embodiments, the carrier-blocking band offset is associated with the second semiconductor alloy having a wider band gap than the first alloy. Because the second alloy composition is associated with a band gap that is larger than and/or offset from, the band gap associated with the first alloy composition, this portion of the compositional grading may be referred to as a "retrograde" profile impeding majority carrier transport through the drain. For exemplary NMOS transistors, the semiconductor source/drain regions provide at least a 0.1 eV offset in the relevant band (conduction or valence) over the retrograded region. As GIDL is a strong function of the band gap, particularly for material overlapping the gate electrode, off-state leakage may be significantly reduced relative to an architecture lacking a semiconductor source/drain region with wide band gap and/or offset band energy.

In some further embodiments, the graded composition of the impurity-doped semiconductor proceeds from the second alloy composition proximal to the first distance to a third alloy composition beyond the first distance (i.e., at a second distance from the channel interface). The third alloy composition is associated with non-blocking band offset and may further have a narrow band gap that is smaller than that associated with the first alloy composition (and second alloy composition). The third alloy composition enables a low resistance metallized contact with the source/drain regions. In advantageous embodiments, the compositional grading between first, second and third alloy compositions is continuous, avoiding the formation of an abrupt junction. The continuous compositional grading along with the impurity doping, which may be $10^{16}$ cm$^{-3}$, or more, advantageously reduces the impact the wide band gap material has on access resistance (e.g., $R_{ext}$).

In some finFET embodiments, the retrograde portion of the source/drain semiconductor is disposed within a fin recess below a gate electrode or gate sidewall spacer. Charge carriers traversing a shortest $L_{eff}$ between the source and drain therefore face the wider band gap material. However, the minimal thickness of the wide band gap material and the continuous grading induces little shift in on-state resistance, perhaps because of higher charge carrier energy in the transistor on-state. In some embodiments described further below, while a mask, such as a gate stack or sacrificial gate stack, is covering the channel region, the compositionally graded doped III-V semiconductor material is overgrown, for example as a phase of a source/drain regrowth process.

FIG. 1 is a plan view of complementary metal-oxide-semiconductor (CMOS) circuitry 100 including a high mobility finFET 101 and a silicon-channeled finFET 102 disposed over a substrate 105 and surrounded by an isolation material 180, in accordance with some embodiments. In the exemplary embodiment, high mobility finFET 101 is an NMOS device while finFET 102 is a PMOS device. For such embodiments, finFET 102 may have any architecture while high mobility finFET 101 has one or more of the structural attributes described further below. In alternate embodiments, high mobility NMOS finFET 101 is coupled with a high mobility PMOS finFET 102.

In some embodiments, substrate 105 is silicon (Si), which is advantageous for monolithic integration of finFETs 101 and 102. Crystallographic orientation of a substantially monocrystalline substrate 105 in exemplary embodiments is (100), (111), or (110). However, other crystallographic orientations are also possible. For example, the substrate working surface may be miscut, or offcut 2-10° toward [110] to facilitate nucleation of crystalline heteroepitaxial material. Other substrate embodiments are also possible. For example, substrate 105 may be any of silicon-carbide (SiC), sapphire, III-V compound semiconductor (e.g., GaAs), silicon on insulator (SOI), germanium (Ge), or silicon-germanium (SiGe). Isolation material 180 may be any material suitable for providing electrical isolation between transistors. In some exemplary embodiments, isolation material 180 is silicon dioxide. Other materials known to be suitable for the purpose may also be utilized, including low-k materials (e.g., having a relative dielectric constant below 2.5).

In the illustrated embodiment, finFET 101 is associated with a transistor cell area smaller than the transistor cell area associated with finFET 102. Specifically, gate length $L_g$ associated with finFET 101 is less than a corresponding gate length $L_{g,2}$ associated with finFET 102. For clarity, source/drain contact length $L_c$ and lateral spacing $L_s$ between source/drain contact metallization 150 and an edge of gate electrode 173 are both equivalent for the two finFETs 101, 102. In this example therefore, the gate length shrink in finFET 101 is manifested as a reduction in source/drain contact metallization pitch $P_c$ of finFET 101 relative to $P_{c,2}$ of finFET 102. A longest lateral length of fin 103 may then be shorter than the corresponding length of fin 104. In other embodiments where access resistance for finFET 101 is relatively high, the gate length shrink in finFET 101 may be utilized for increased source/drain contact length $L_c$ without increasing contact metallization pitch $P_c$ of finFET 101 beyond $P_{c,2}$. As noted above, off-state leakage current for a high mobility channel material may be considerably higher than for a silicon-channeled device of comparable effective channel length. Thus, in some embodiments, a compositionally graded semiconductor is incorporated into a doped source/drain, for example within a region of the source/drain disposed at least within lateral spacing 131. The graded material thickness, alloy compositional variation, and impurity doping of the graded semiconductor may be tuned to reduce GIDL with minimal impact to on-state performance.

Although specific dimensions vary with device technology generation, in one example where $L_{g,2}$ is approximately 10 nm, $L_g$ may be 2-5 nm smaller, providing up to a 50% lateral gate shrink. In the illustrated example, compositionally graded semiconductor is disposed within at least one lateral spacing 127 to retrograde the drain region over a distance of 1-3 nm. In some embodiments, the retrograde profile is present only in the drain. However, in advantageous embodiments where symmetry of transistor 101 is maintained, the compositionally graded impurity-doped material is disposed on both source and drain sides of the channel region. Such a symmetrical architecture allows a drain of one transistor to be employed as a source of another transistor. Depending on the extent of the band offset within the retrograded source/drain region, finFET 101 may display off-state leakage comparable to, or better than, that of finFET 102.

Figure 2A:
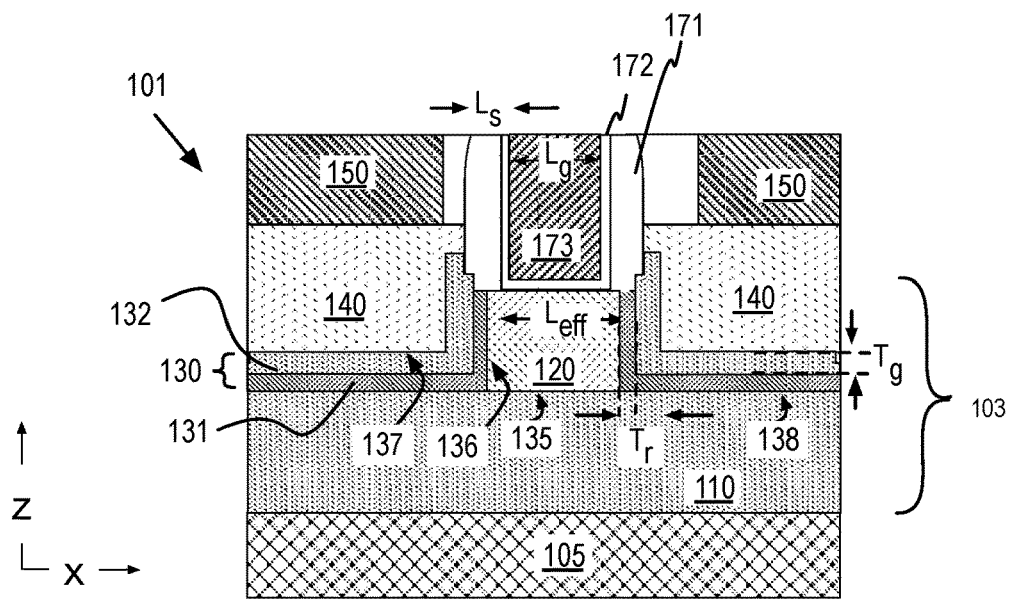
FIG. 2A illustrates a cross-sectional view through a length of channel region and source/drain regions of the high mobility finFET depicted in FIG. 1, in accordance with some embodiments.

A fin of first III-V semiconductor material may be disposed directly on a substrate or some intervening material. In some exemplary embodiments, transistor 101 incudes a semiconductor heterojunction fin ("hetero-fin") structure 103 that further includes a first semiconductor material disposed on a "sub-fin" of a second semiconductor material, as further described below. FIG. 2A illustrates a cross-sectional view through a length of channel region and source/drain of high mobility finFET 101 along the A-A' plane denoted in FIG. 1, in accordance with some embodiments. FIG. 2C illustrates a cross-sectional view through a fin width within a channel region of high mobility finFET 101, in accordance with some embodiments.

Figure 2B:
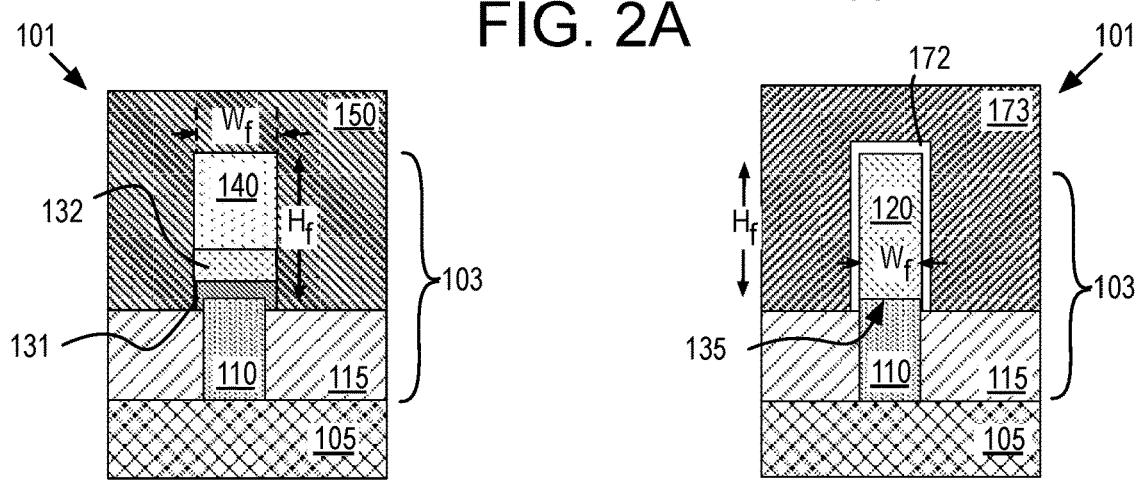
FIG. 2B illustrates a cross-sectional view through a fin width within a source/drain region of the high mobility finFET depicted in FIG. 1, in accordance with some embodiments.
Figure 2C:
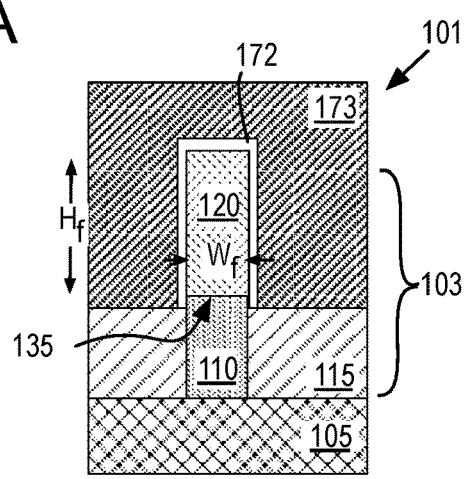
FIG. 2C illustrates a cross-sectional view through a fin width within a channel region of the high mobility finFET depicted in FIG. 1, in accordance with some embodiments.

As shown in FIG. 2A-2C, hetero-fin 103 includes a channel region 120 disposed on a sub-fin 110. Sub-fin 110 is embedded in sub-fin isolation 115 (FIGS. 2B, 2C), which may be any amorphous material suitable for providing electrical isolation between adjacent sub-fins. In some exemplary embodiments, sub-fin isolation 115 is silicon dioxide. Other known dielectric materials may also be employed, including low-k materials. Although embodiments are not limited in this respect, other exemplary materials include carbon-doped oxides, siloxane derivatives, and the like. Channel region 120 is of a first semiconductor material while the sub-fin 110 is of a second semiconductor material. The two different materials form a channel/sub-fin heterojunction 135. In some exemplary embodiments where sub-fin 110 does not serve as part of the device channel, sub-fin 110 need not be of a material having high electron mobility. In some advantageous embodiments, sub-fin 110 is a second material of suitable composition so that heterojunction 135 is associated with a band energy offset between the channel region 120 and sub-fin 110 useful for reducing a substrate leakage current path through sub-fin 110. In some N-type transistor embodiments where channel region 120 is to provide an electron channel, sub-fin 110 may have a higher conduction band energy (i.e., a carrier-blocking conduction band offset).

In some embodiments, sub-fin 110 and channel region 120 are each monocrystalline compound semiconductors with a first sub-lattice of at least one element from group III of the periodic table (e.g., Al, Ga, In), and a second sub-lattice of at least one element of group V of the periodic table (e.g., P, As, Sb). Sub-fin 110 may be a binary, ternary, or quaternary III-V compound semiconductor that is an alloy of two, three, or even four elements from groups III and V of the periodic table. For exemplary N-type transistor embodiments, channel region 120 is advantageously a III-V material having a high electron mobility, such as, but not limited to InGaAs, InP, InSb, and InAs. For some exemplary embodiments, channel region 120 is a ternary III-V alloy, such as InGaAs or GaAsSb. For some $In_xGa_{1-x}As$ fin channel semiconductor embodiments, In content, x, is between 0.1 and 0.9, and advantageously is at least 0.5 (e.g., $In_{0.53}Ga_{0.47}As$). In some embodiments with highest mobility, a channel region 120 is intrinsic III-V material and not intentionally doped with any electrically active impurity. In alternate embodiments, one or more a nominal impurity dopant level may be present within the channel region, for example to set a threshold voltage $V_t$, or to provide HALO pocket implants, etc. Even for impurity-doped channel embodiments however, impurity dopant level within channel region 120 is relatively low, for example below $10^{15}$ $cm^{-3}$, and advantageously below $10^{13}$ $cm^{-3}$.

Sub-fin 110 is advantageously a III-V material having a significant carrier-blocking band offset (e.g., conduction band offset for N-type devices) from that of the fin material. Exemplary materials, include, but are not limited to, GaAs, GaSb, GaAsSb, GaP, InAlAs, GaAsSb, AlAs, AlP, AlSb, and AlGaAs. In some N-type transistor embodiments, sub-fin 110 may have a higher conduction band energy and is also doped with p-type impurities (e.g., Mg, Be, etc.).

Channel region 120 is disposed below (or covered by) gate electrode 173 and gate dielectric 172. As illustrated in FIGS. 2A and 2C, a metal-insulator gate stack includes a gate dielectric material 172 and a gate electrode material 173. While any known gate stack materials may be utilized, in one exemplary embodiment a high-k material having a bulk relative dielectric constant of 9, or more is employed as the gate dielectric along with a gate metal that has a work function suitable for the composition of channel region 120. Exemplary high-k materials include metal oxides, such as, but not limited to $H_fO_2$. In the embodiments illustrated by FIG. 2C, gate dielectric 172 is disposed directly on sidewalls of fin 120 that define the transverse fin width $W_f$. Gate sidewall spacers 171 may be of any dielectric material, and may be in contact with a sidewall of gate electrode 173, or as shown, in contact with gate dielectric 172 that covers sidewalls of gate electrode 173. The lateral dimensions of gate sidewall spacers 171 may vary anywhere from 1 to 10 nm, for example. In some exemplary embodiments, gate sidewall spacers 171 provide 2-5 nm of lateral spacing between gate electrode 173 and semiconductor source/drain region 140.

In some "gate underlap" embodiments illustrated by FIG. 2A, a portion of channel region 120 is further disposed below (or covered by) dielectric gate sidewall spacers 171, which are adjacent to opposite edges of gate electrode 173. Channel region 120 need not extend beyond length of gate electrode 173. In the exemplary embodiment illustrated, at least a retrograde portion 131 of a compositionally-graded, impurity-doped semiconductor source/drain 130 is disposed below (or covered by) gate sidewall spacers 171. A dopant junction 136 is at the interface of lightly (or undoped) channel semiconductor and a heavily-doped source/drain semiconductor, for example having an (n-type) impurity concentration of at least $10^{16}$ $cm^{-3}$. In the illustrated embodiments, impurity-dopant junction 136 located below gate sidewall spacers 171. Alternatively, dopant junction 136 may be disposed below gate electrode 173.

Compositionally-graded and impurity-doped source/drain region 130 is a compound semiconductor. In some exemplary embodiments, the compound comprises a first sub-lattice of at least one element from group III of the periodic table (e.g., Al, Ga, In), and a second sub-lattice of at least one element of group V of the periodic table (e.g., P, As, Sb). Graded source/drain region 130 may be a binary, ternary, or quaternary III-V compound semiconductor that is an alloy of two, three, or even four elements from groups III and V of the periodic table. Graded, doped source/drain region 130 is graded to have a band offset from the channel semiconductor region 120. In some embodiments where channel region 120 and graded source/drain 130 both comprise Ga or As alloys, channel region 120 has a higher concentration of In or Sb than does a portion of graded 130. Alternatively, graded source/drain may have a higher concentration of Al or P than does channel region 120. In advantageous embodiments, graded source/drain region 130 is monocrystalline, having the same crystal orientation as channel region 120.

In some embodiments, compositional grading of the source/drain semiconductor begins at dopant junction 136. The initial source/drain alloy composition may vary, but in some exemplary embodiments, the source/drain composition proximate to dopant junction 136 is approximately the same as that of channel region 120 to avoid an abrupt heterojunction at dopant junction 136. In other words, the source/drain semiconductor composition is graded over a retrograde film thickness $T_r$, from the composition of channel region 120 to a second alloy composition with a band offset and/or larger band gap. In some embodiments, the second alloy composition has a band gap that is at least 0.25 eV larger than the band gap of the first alloy composition. In an exemplary embodiment where the channel region 120 comprises an alloy of InGaAs or GaAsSb, the source/drain semiconductor composition is graded over retrograde film thickness $T_r$, reaching an alloy composition that has an In or Sb content that is no more than half that of the first alloy composition.

Figure 3A:
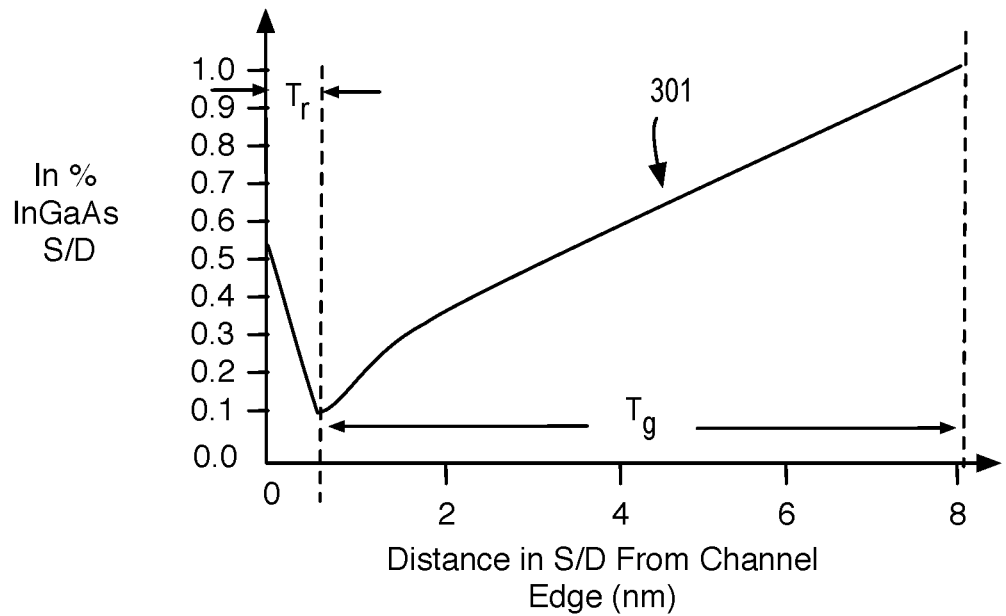
FIG. 3A illustrates a retrograde alloy composition profile for an impurity-doped source/drain region, in accordance with some alternate embodiments.

In some $In_xGa_{1-x}As$ embodiments, the first alloy composition comprises $In_xGa_{1-x}As$, and x is at least 0.4. FIG. 3A illustrates a graded alloy composition profile 301 modeled for an impurity-doped $In_xGa_{1-x}As$ source/drain region, in accordance with some embodiments. In FIG. 3A, the y-axis is coincident with dopant junction 136 (FIG. 2A) where the first alloy composition comprises $In_xGa_{1-x}As$, and x is 0.53. Over the retrograde film thickness $T_r$, Indium content is continuously reduced (e.g., linearly retrograded) to a second $In_xGa_{1-x}As$, alloy composition in which In content x is no more than 0.15, and advantageously approximately 0.10. A smooth linear grading may minimize the electron-tunneling barrier in the source junction and thus, a maintain low access resistance. Grading over the compositional range is also advantageously steep, with the retrograde film thickness $T_r$ being less than 3 nm, and advantageously less than 2 nm. In the embodiments further illustrated by FIG. 2A, retrograde film thickness $T_r$ is less than the lateral width $L_s$ of gate sidewall spacers 171. However, retrograde film thickness $T_r$ may also be sufficiently thick so as to extend laterally beyond sidewall spacers 171. Retrograde film thickness $T_r$ may be selected based on the band gap at $T_r$. For example, a retrograde film reaching a larger band gap relative to the channel may be advantageously thinner to limit on-state current blocking.

Figure 3B:
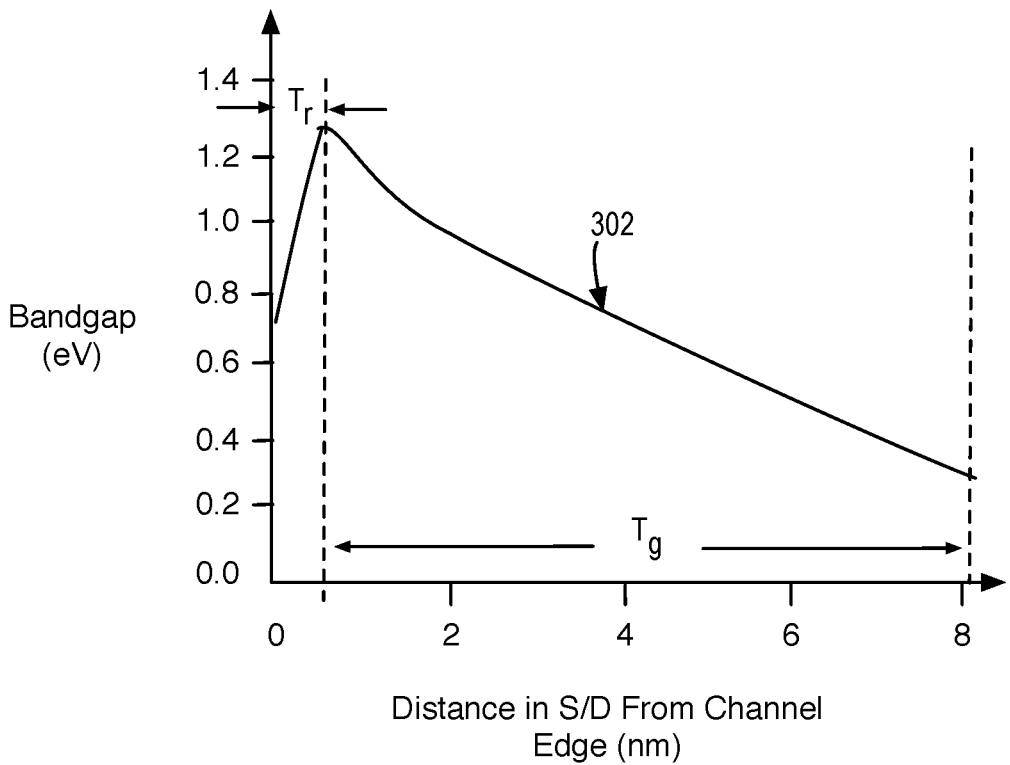
FIG. 3B illustrates a band gap profile for an impurity-doped source/drain region with the retrograde alloy composition profile illustrated in FIG. 3A, in accordance with some alternate embodiments.

Variation in the band energy within the source/drain regions is a function of the compositional change. In some embodiments, the band gap increases by at least 1.5 times over the retrograde film thickness $T_r$. FIG. 3B illustrates a band gap profile 302 for an impurity-doped $In_xGa_{1-x}As$ source/drain region with the graded composition profile 301, in accordance with some embodiments. For this example, band gap varies from 0.7 eV to about 1.3 eV over the retrograde film thickness $T_r$.

As further illustrated in FIG. 2A, graded and doped source/drain 130 includes a graded region 132 over which the alloy composition is modulated over a graded film thickness $T_g$ in a manner opposite that of the retrograde region 131. Within graded film thickness $T_g$, the alloy composition is reduced continuously from the wide band gap material to a narrow band gap material having a band gap that is smaller than that of the first alloy composition. In some embodiments, the source/drain alloy composition at $T_g$ has a band gap that is at least 0.5 eV smaller than the alloy composition of the wide band gap material at $T_r$. In some exemplary InGaAs embodiments further illustrated by FIG. 3A, Indium content is increased linearly from approximately 0.10 to 1.0 (InAs) within the graded film thickness $T_g$. Because the grading direction within graded film thickness $T_g$ is non-blocking, it may be many nanometers thick (e.g., 6-10 nm, or more).

As further illustrated in FIG. 2A, graded source/drain region 130 forms a second interface 137 where the compositional grading ends. A source/drain cap 140 of fixed III-V composition couples graded region 132 to contact metallization 150. Source/drain cap 140 may be of any material suitable to provide ohmic contact with metallization 150. In some embodiments where InGaAs is retrograded and then graded up to InAs, a low resistance with contact metallization 150 (e.g., Ti/TiN) may be achieved. In advantageous embodiments, source/drain cap 140 is single-crystalline and heavily doped (e.g., n-type in NMOS embodiments) to substantially the same impurity level as graded source/drain region 130.

FIG. 2B illustrates a cross-sectional view through a fin width within a source/drain region, in accordance with some embodiments. As further illustrated by FIGS. 2A and 2B, there is a heterojunction 138 where compositionally graded source/drain region 130 interfaces with sub-fin 110. With the first alloy composition (e.g., $In_{0.53}Ga_{0.47}As$) proximal to the sub-fin interface, an abrupt heterojunction between channel region 120 and the source/drain is avoided while an abrupt heterojunction is maintained at the sub-fin. The retrograding of the source/drain near the sub-fin heterojunction 138 may also advantageously reduce substrate leakage current through sub-fin 110. As described further below, the presence of compositionally graded source/drain region 130 between source/drain cap 140 and sub-fin 110 is indicative of the technique employed to form graded source/drain region 130. Consistency in the graded thicknesses $T_r$ and $T_g$ over channel region 120 and sub-fin 110 is indicative of a re-growth technique employed to form graded source/drain region 130 over a recessed fin, as described further below.

Figure 2D:
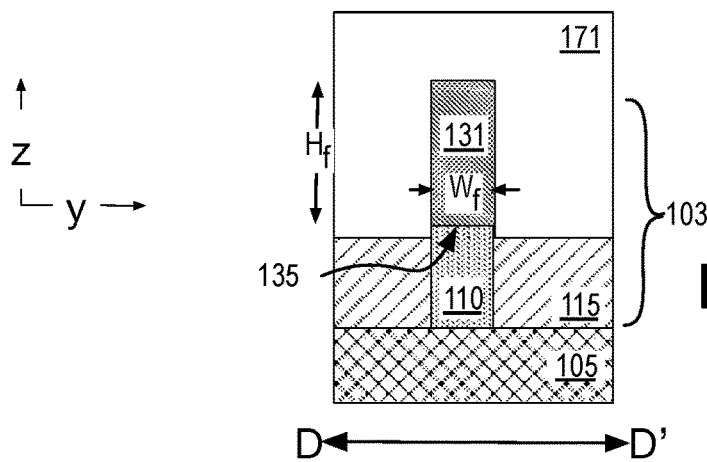
FIG. 2D illustrates a cross-sectional view through a fin width within a gate sidewall spacer region of the high mobility finFET depicted in FIG. 1, in accordance with some embodiments.

In some embodiments the current carrying cross-sectional area of a graded source/drain region is substantially equal to the current carrying cross-sectional area of the fin channel region. FIG. 2D illustrates a cross-sectional view through a hetero-fin width along the D-D' plane denoted in FIG. 1, in accordance with some embodiments. The D-D' plane passes through lateral spacing 127 (FIG. 1) within retrograded source/drain region 131 near where the heterojunction 136 (FIG. 2A) forms an interface with channel region 120 across the transverse fin width $W_f$. As further illustrated in FIG. 2D, retrograded source/drain region 131 covers the entire fin z-height $H_f$. In contrast, retrograded source/drain region 131 is substantially absent from the majority of sub-fin 110 embedded within sub-fin isolation 115.

Figure 4A:
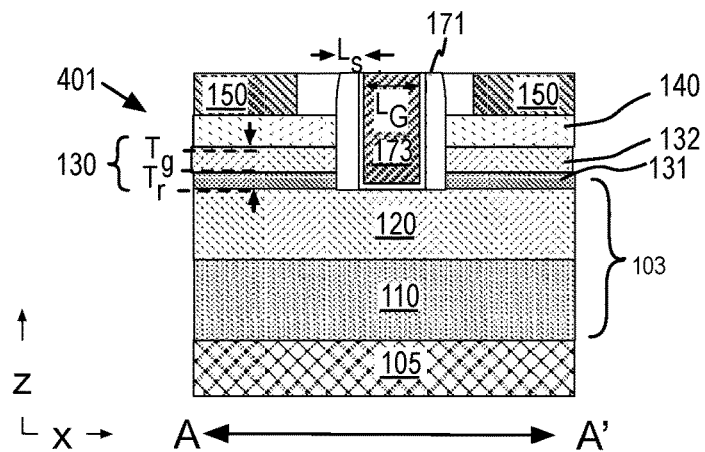
FIG. 4A illustrates a cross-sectional view through a length of channel region and source/drain of the high mobility finFET depicted in FIG. 1, in accordance with some alternate embodiments.
Figure 4B:
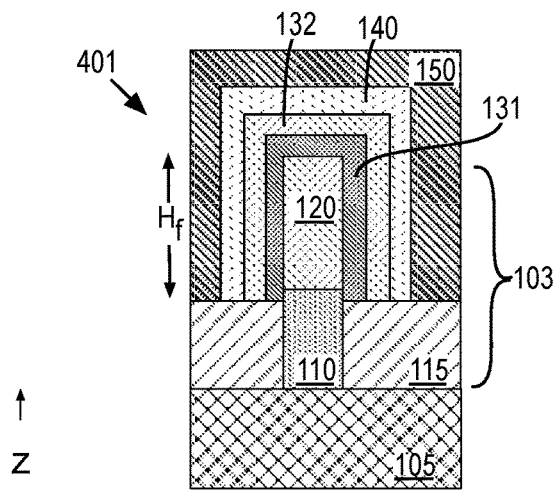
FIG. 4B illustrates a cross-sectional view through a fin width within a source/drain region of the high mobility finFET depicted in FIG. 1, in accordance with some alternate embodiments.
Figure 4C:
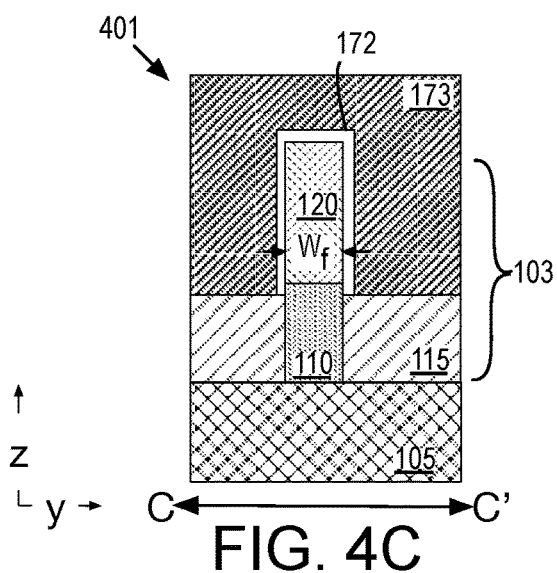
FIG. 4C illustrates a cross-sectional view through a fin width within a channel region of the high mobility finFET depicted in FIG. 1, in accordance with some alternate embodiments.
Figure 5:
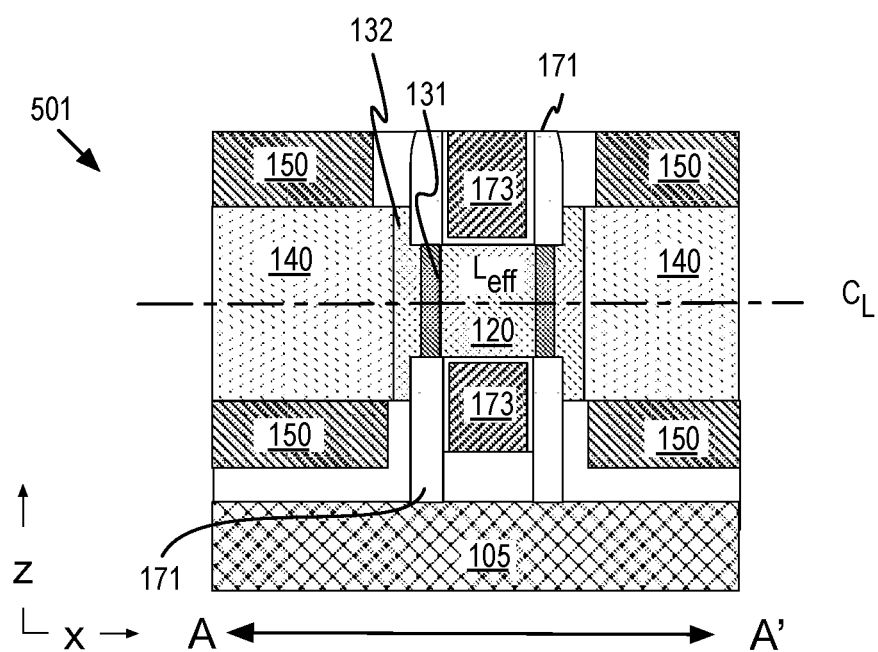
FIG. 5 illustrates a cross-sectional view through a length of channel region and source/drain of a nano-wire high mobility FET, in accordance with some alternate embodiments.

Notably, the architectural elements described above in the context of finFET 101 may be applied to a wide array of other finFET architectures. FIG. 4A-4C, for example, depict a finFET 401 in accordance with some alternate embodiments. FinFET 401 has substantially the same layout/footprint as illustrated for finFET 101 (FIG. 1). However, finFET 401 includes a retrograded source/drain region 131 disposed over a full-height fin 120 rather than the regrown source/drain described for finFET 101. As another example, FIG. 5 depicts a nanowire FET 501 having substantially the same layout/footprint as illustrated for finFET 101 in FIG. 1. Nanowire FET 401 however has a gate stack and source/drain region that wraps completely around a III-V channel material.

FIG. 4A illustrates a cross-sectional view of finFET 401 through the A-A' plane depicted in FIG. 1, in accordance with some alternate embodiments. FIG. 4B illustrates a cross-sectional view of finFET 401 through the B-B' plane depicted in FIG. 1, in accordance with some alternate embodiments. Likewise, FIG. 4C illustrates a cross-sectional view of finFET 401 through the C-C plane depicted in FIG. 1, in accordance with some alternate embodiments. The graded source/drain region 130 (FIGS. 4A, 4B) offset a narrow band gap source/drain cap 140 from fin 120. Sub-fin 110, fin 120, and graded source/drain region 130 may have any of the properties discussed above in the context of finFET 101. For example, graded source/drain region 130 may be a graded to a ternary III-V material of wider band gap than that of a ternary III-V channel region 120. Source/drain cap 140 may also have any of the properties described above in the context of finFET 101 (e.g., a narrow band gap, heavily-doped n-type III-V material. Graded source/drain region 130 forms a shell around end portions of fin 120, and source/drain cap 140 forms a shell around graded source/drain region 130, as further illustrated by FIG. 4B. The profile illustrated in FIG. 4B is applicable over the entire source/drain contact length because the z-height of fin 120 beyond gate sidewall spacer 171 is constant. In some embodiments, graded source/drain region 130 and source/drain cap 140 do not replace any portion of fin 120, and instead are successively epitaxially grown over fin 120. Any of the growth techniques further describe below may be employed to form graded source/drain region 130, for example as an initial epitaxial growth phase preceding a secondary epitaxial growth phase of source/drain cap 140.

FIG. 5 illustrates a cross-sectional view of nanowire FET 501 through the A-A' plane depicted in FIG. 1, in accordance with some embodiments. As shown, graded source/drain region 130 is substantially symmetrical about a longitudinal axis $C_L$ of channel region 120. In this illustrative embodiment, sub-fin semiconductor has been completely replaced with gate stack materials, source/drain cap 140, and contact metallization 150. With graded source/drain region 130 formed as an initial phase of source/drain growth, channel region 120 is effectively capped at opposite ends with impurity-doped graded source/drain region 130.

Figure 6:
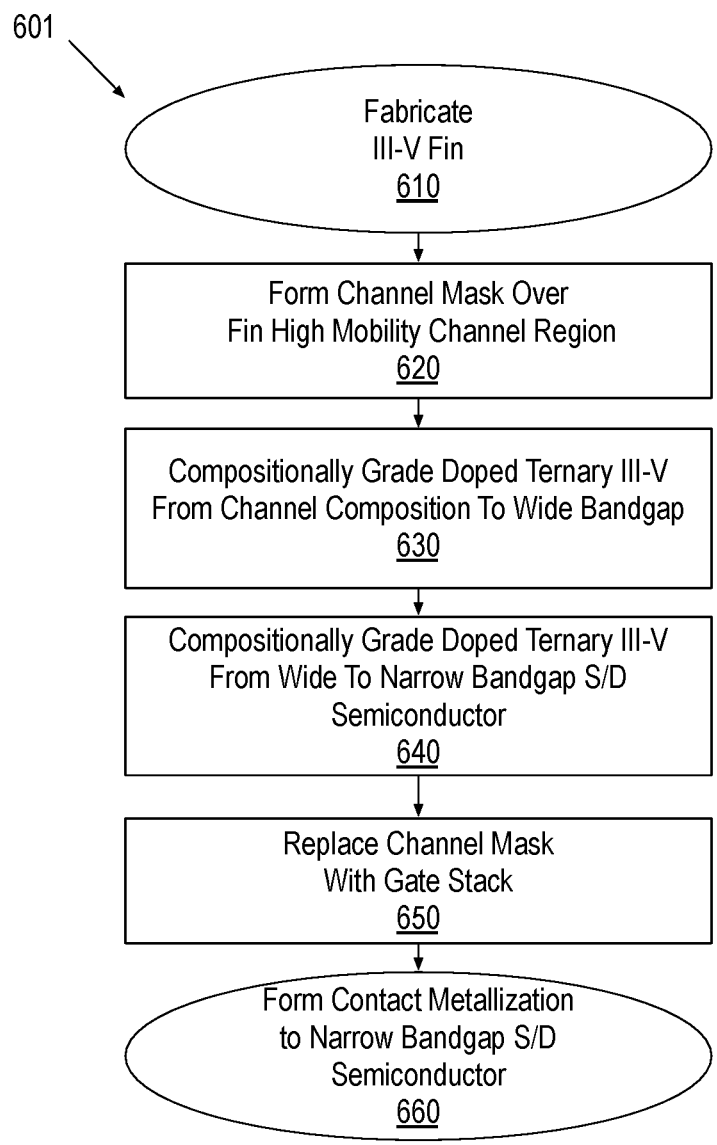
FIG. 6 is a flow diagram illustrating a method of fabricating a high mobility finFET with a compositionally retrograded impurity-doped semiconductor source/drain, in accordance with some embodiments.

High mobility finFETs in accordance with the architectures above may be fabricated by a variety of methods applying a variety of techniques and processing chamber configurations. FIG. 6 is a flow diagram illustrating an exemplary method 601 for fabricating a high mobility finFET with an impurity-doped, retrograded source/drain, in accordance with some embodiments. FIGS. 7A, 7B, 7C, 7D, 7E, 7F, and 7G illustrate cross-sectional views along the A-A' plane of finFET 101 evolving as the method 601 is performed, in accordance with some embodiments. FIGS. 8A, 8B, 8C, 8D, 8E, 8F, and 8G illustrate cross-sectional views along the B-B' plane of finFET 101 evolving as the method illustrated in FIG. 6 is performed, in accordance with some embodiments.

Referring first to FIG. 6, method 601 begins at operation 610 where a fin of III-V semiconductor material is formed. In some embodiments, III-V hetero junction fins are fabricated, for example by epitaxially growing numerous islands of III-V material over a silicon substrate having a plurality of seeding surface regions. In some such embodiments, seeding surface regions are surrounded by high aspect ratio sidewalls to practice aspect ratio trapping (ART) and achieve acceptable crystal quality in the heteroepitaxial fin material. The ART technique is one example of local additive heteroepitaxial fin fabrication, which may advantageously reduce the effects of lattice mismatch across various heterojunctions. In alternative embodiments, a conventional subtractive technique may be employed in which a blanket III-V film stack is grown over, or transferred to, an entire working surface of a substrate. That blanket III-V film stack is then etched into fin structures similarly amenable to subsequent operations of method 601.

Figures 7A, 8A:
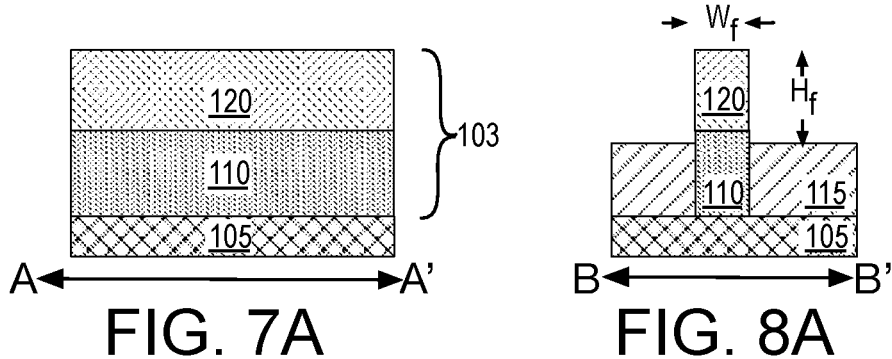
FIGS. 7A, 7B, 7C, 7D, 7E, 7F and 7G illustrate cross-sectional views through a length of the channel region and source/drain regions of a high mobility finFET evolving as the method illustrated in FIG. 6 is performed, in accordance with some embodiments.
FIGS. 8A, 8B, 8C, 8D, 8E, 8F and 8G illustrate cross-sectional views through a width of a fin structure within a region of a high mobility finFET evolving as the method illustrated in FIG. 6 is performed, in accordance with some embodiments.

In the exemplary embodiments illustrated by FIGS. 7A and 8A, upon completion of operation 610, hetero-fin 103 is disposed on substrate 105 with at least a portion of channel region 120 extending above a surrounding sub-fin isolation 115 by a z-height $H_f$. In some embodiments, z-height $H_f$ is defined by recess etching a predetermined amount of sub-fin isolation material 115 from around hetero-fin 103. Z-height $H_f$ may vary with the extent of recess etch, potentially exposing sidewalls of sub-fin 110. In alternate embodiments, a stop layer may be utilized to ensure a top surface of sub-fin isolation 115 is flush with the heterojunction between sub-fin 110 and fin 120. At this point, transverse fin width $W_f$ is substantially constant along the entire longitudinal length of a fin.

Returning to FIG. 6, method 601 continues at operation 620 where a channel mask is patterned to protect a portion of the III-V fin that is to become the III-V FET channel region. While any known masking technique and material(s) may be employed at operation 620, in some embodiments, the channel mask is a gate mandrel retained through a number of processes until being replaced in a "gate-last" finFET fabrication flow. Such embodiments may be advantageously compatible with silicon-channeled finFET fabrication, for example enabling PMOS transistors to be concurrently fabricated in other regions of the substrate (not depicted).

Figures 7B, 8B:
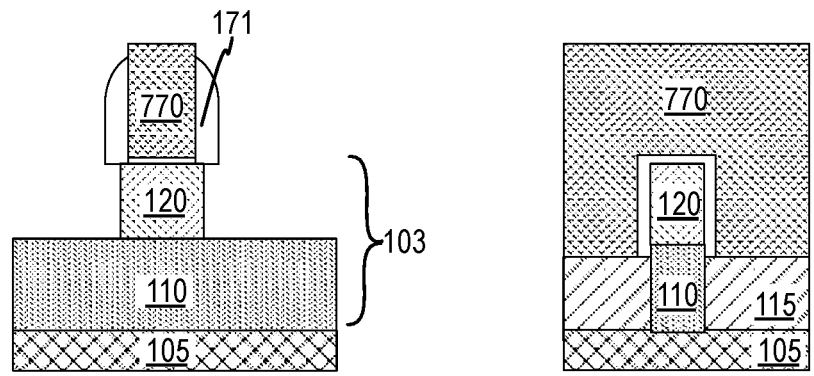
Figures 7C, 8C:
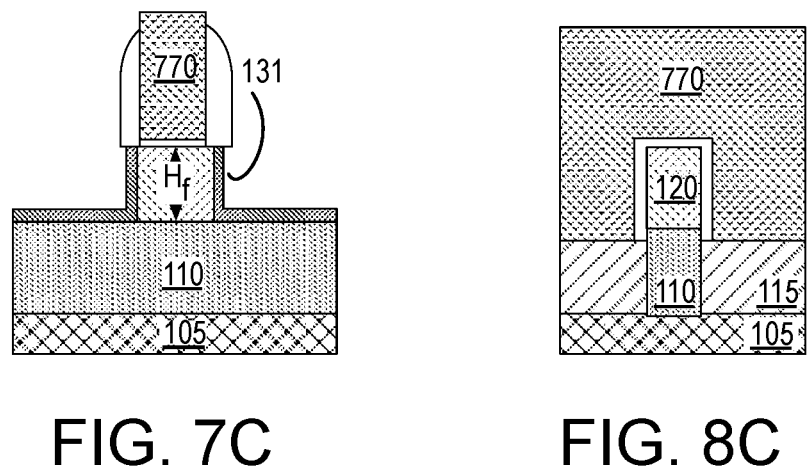
Figure 7D:
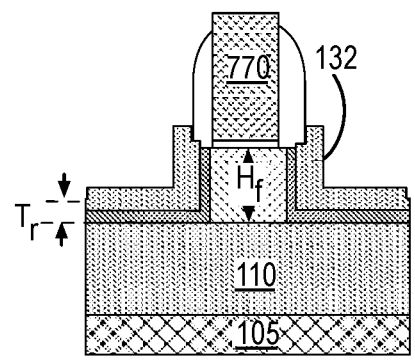
Figure 8D:
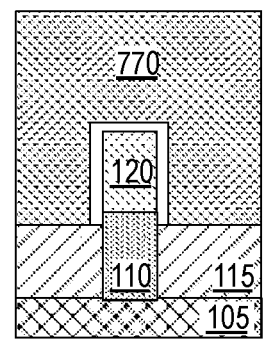

In the exemplary embodiment illustrated in FIGS. 7B and 8B, a sacrificial gate 770 is formed over a portion of the hetero-fin 103. Any known sacrificial gate structure and fabrication techniques may be employed at operation 620 to form sacrificial gate 770 on at least two opposing sidewalls of fin 120 (FIG. 8B). Sacrificial gate 770 is patterned into a stripe of sacrificial material extending over channel region 120 and landing on sub-fin isolation 115. Other portions of hetero-fin 103 are exposed. In further embodiments represented by FIG. 7B, the channel mask further includes a gate sidewall spacer 171 adjacent to sacrificial gate 770. Any conventional self-aligned lateral spacer process may be employed at operation 620 to laterally stand-off subsequent processing from sacrificial gate 770. For example, a dielectric (e.g., silicon dioxide and/or silicon nitride) may be conformally deposited over the hetero-fin and over the channel mask. An anisotropic etch is then employed to clear the dielectric except along edged of topography.

In some embodiments, portions of the fin not protected by the channel mask or sub-fin isolation may be recess etched prior to epitaxial overgrowth of a retrograded III-V source/drain region. In the example illustrated by FIG. 7B, portions fin 120 not protected by the channel mask or sub-fin isolation 115 are recessed etched. This recess etch may undercut lateral spacer 171 by some predetermined amount, or not. A crystallographic wet etchant may be employed or a low damage, chemical dry etchant, for example. In some embodiments, fin 120 is recessed etched selectively to sub-fin 110. Surfaces of fin 120 and/or sub-fin 110 are then prepared for seeding an epitaxial (re)growth.

Returning to FIG. 6, method 601 continues at operation 630 where an impurity-doped III-V semiconductor material is epitaxially grown on surfaces of the fin not protected by the channel mask or sub-fin isolation. As further illustrated in FIG. 7C, a retrograded III-V source/drain region 131 is grown by any epitaxial growth process. Any of metal-organic chemical vapor deposition (MOCVD), molecular beam epitaxy (MBE), hydride vapor phase epitaxy (HVPE), or the like, may be employed to grow compositionally graded semiconductor material with in-situ impurity doping. In some embodiments, a ternary source/drain material, such as InGaAs or GaAsSb, is grown with a linear grading that continuously lowers In or Sb concentration during a first phase of a source/drain overgrowth.

Figure 7E:
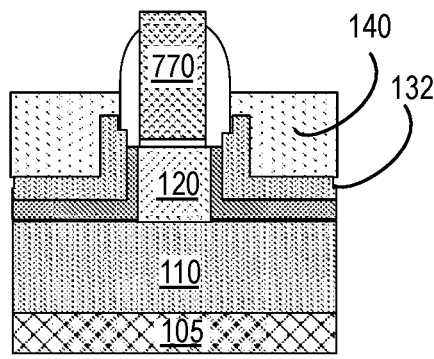
Figure 8E:
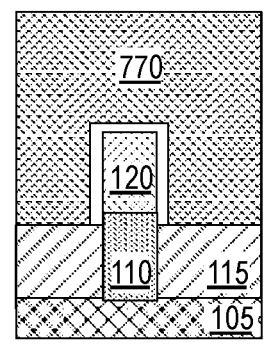
Figure 8F:
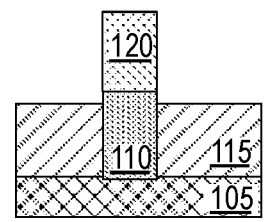

After grading the III-V alloy composition to a largest band offset and/or widest band gap of the source/drain, method 601 proceeds to operation 640 where a graded III-V source/drain region is grown. The graded III-V source/drain region may be grown, for example by, continuing the epitaxial growth process with a second in-situ growth phase during which one or more alloy constituent that reduces the conduction band offset and/or the material band gap is linearly graded to higher concentration. In some embodiments, a ternary source/drain material, such as InGaAs or GaAsSb, is grown with a linear grading that continuously increases In or Sb concentration during the second phase of a source/drain overgrowth. In exemplary embodiments further illustrated in FIGS. 7D and 8D, a single crystalline graded source/drain region 132 is grown during the second growth phase. Upon grading down to a target band gap or composition (e.g., InAs), the alloy composition may be held fixed for the duration of the semiconductor source/drain regrowth. FIGS. 7E and 8E illustrate a single crystalline narrow band gap source/drain region 140 grown during the final in-situ source/drain growth phase. In-situ doping may be performed throughout operations 630 and 640 to form n-type material.

Figure 7F:
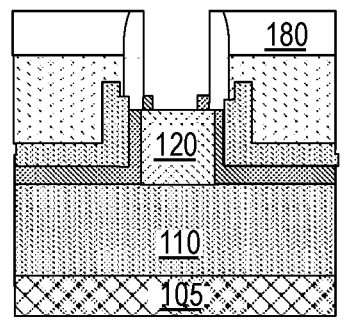
Figure 7G:
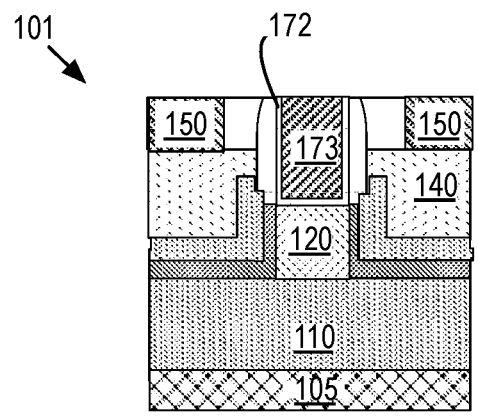
Figure 8G:
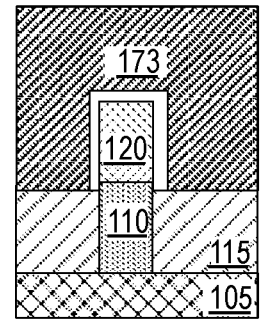

Returning to FIG. 6, method 601 continues at operation 650 where the channel mask is replaced with a permanent gate stack. Method 601 is then substantially completed with any suitable contact metallization and backend processing performed at operation 660. For the exemplary embodiment further illustrated in FIGS. 7F and 8F, finFET isolation 180 is deposited and planarized to expose a top of sacrificial gate 770. Sacrificial gate 770 is removed selectively relative to isolation 180, thereby exposing the lateral channel region of fin 120. A permanent gate stack including a gate dielectric 172 and gate electrode 173 is formed over at least two sidewalls of the fin structures, as depicted in FIGS. 7G and 8G. While any known gate stack materials may be utilized, in one exemplary embodiment a high-k dielectric material is deposited along with a metal gate electrode having a work function suitable for the III-V composition of fin 120. As further illustrated in FIGS. 7G and 8G, source/drain contact metallization 150 is formed for example by depositing Ti and/or TiN on narrow band gap III-V source/drain cap 140. The structure of high mobility finFET 101 is then substantially as introduced in FIGS. 1 and 2A-2D, and is ready for backend processing following any known techniques.

Figure 9:
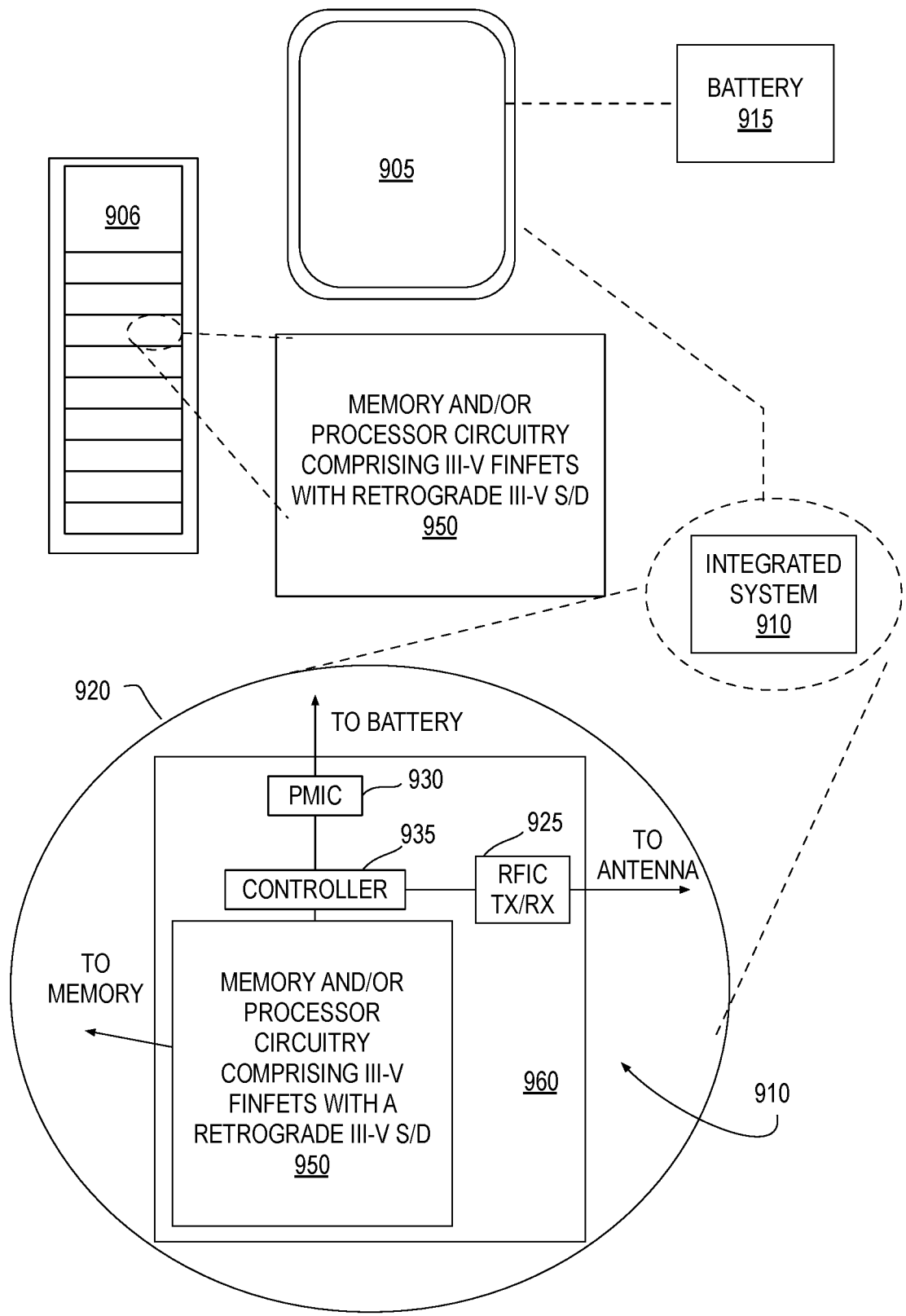
FIG. 9 illustrates a mobile computing platform and a data server machine employing an SoC including a plurality of high mobility finFETs including compositionally retrograded impurity-doped source/drain region, in accordance with embodiments of the present invention.

FIG. 9 illustrates a mobile computing platform and a data server machine employing an SoC including high mobility finFETs with retrograde source/drain region, for example as describe elsewhere herein. The server machine 906 may be any commercial server, for example including any number of high-performance computing platforms disposed within a rack and networked together for electronic data processing, which in the exemplary embodiment includes a packaged monolithic SoC 950. The mobile computing platform 905 may be any portable device configured for each of electronic data display, electronic data processing, wireless electronic data transmission, or the like. For example, the mobile computing platform 905 may be any of a tablet, a smart phone, laptop computer, etc., and may include a display screen (e.g., a capacitive, inductive, resistive, or optical touchscreen), a chip-level or package-level integrated system 910, and a battery 915.

Whether disposed within the integrated system 910 illustrated in the expanded view 920, or as a stand-alone packaged chip within the server machine 906, packaged monolithic SoC 950 includes a memory block (e.g., RAM), a processor block (e.g., a microprocessor, a multi-core microprocessor, graphics processor, or the like) including at least one high mobility n-type finFET with a retrograde source/drain region, for example as describe elsewhere herein. The monolithic SoC 950 may be further coupled to a board, a substrate, or an interposer 960 along with, one or more of a power management integrated circuit (PMIC) 930, RF (wireless) integrated circuit (RFIC) 925 including a wideband RF (wireless) transmitter and/or receiver (TX/RX) (e.g., including a digital baseband and an analog front end module further comprises a power amplifier on a transmit path and a low noise amplifier on a receive path), and a controller 935.

Functionally, PMIC 930 may perform battery power regulation, DC-to-DC conversion, etc., and so has an input coupled to battery 915 and with an output providing a current supply to other functional modules. As further illustrated, in the exemplary embodiment, RFIC 925 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G, and beyond. In alternative implementations, each of these board-level modules may be integrated onto separate ICs or integrated into monolithic SoC 950.

Figure 10:
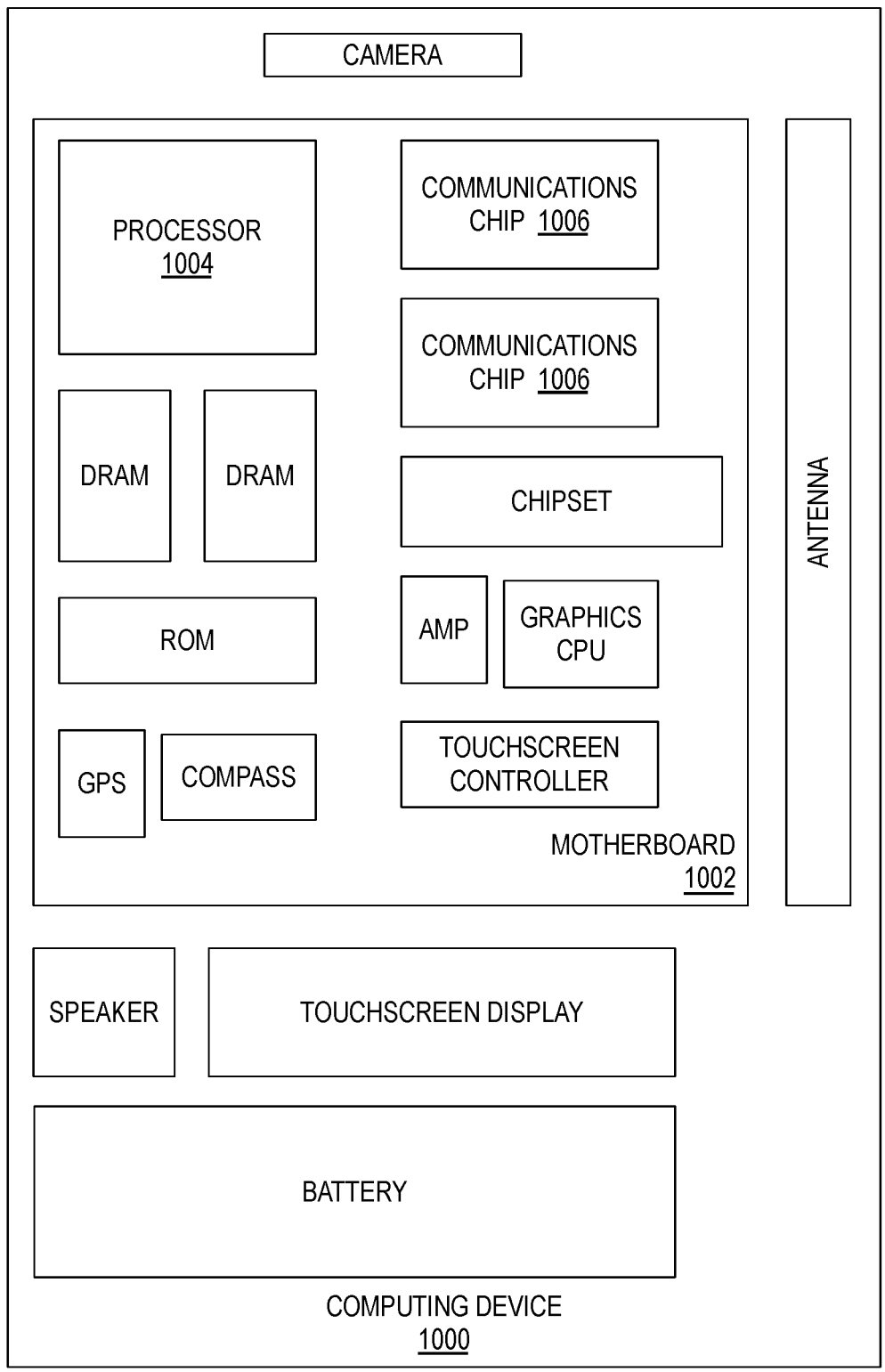
FIG. 10 is a functional block diagram of an electronic computing device, in accordance with an embodiment of the present invention.

FIG. 10 is a functional block diagram of an electronic computing device, in accordance with an embodiment of the present invention. Computing device 1000 may be found inside platform 905 or server machine 906, for example. Device 1000 further includes a motherboard 1002 hosting a number of components, such as, but not limited to, a processor 1004 (e.g., an applications processor), which may further incorporate at least one high mobility finFET with a retrograde source/drain region, for example as describe elsewhere herein. Processor 1004 may be physically and/or electrically coupled to motherboard 1002. In some examples, processor 804 includes an integrated circuit die packaged within the processor 10904. In general, the term "processor" or "microprocessor" may refer to any device or portion of a device that processes electronic data from registers and/or memory to transform that electronic data into other electronic data that may be further stored in registers and/or memory.

In various examples, one or more communication chips 1006 may also be physically and/or electrically coupled to the motherboard 1002. In further implementations, communication chips 1006 may be part of processor 1004. Depending on its applications, computing device 1000 may include other components that may or may not be physically and electrically coupled to motherboard 1002. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1006 may enable wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1006 may implement any of a number of wireless standards or protocols, including but not limited to those described elsewhere herein. As discussed, computing device 1000 may include a plurality of communication chips 1006. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In one or more first embodiments, a monolithic high mobility field effect transistor, comprises a gate electrode disposed over a channel region comprising a first III-V semiconductor material of a first alloy composition. The transistor includes a pair of semiconductor source/drain regions impurity doped to a same conductivity type and interfacing the channel region. The source/drain regions comprise a compositionally graded III-V semiconductor alloy varying between the first alloy composition proximal to an interface of the channel region and a second alloy composition a first distance from the interface, material with the second alloy composition having a charge carrier-blocking band offset from material with the first alloy composition, and further varying between the second alloy composition and a third alloy composition at a second distance from the interface, material with the third alloy composition having a non-blocking band offset from material with the second alloy composition.

In furtherance of the first embodiments, the second alloy composition has a band gap that is at least 0.25 eV larger than the band gap of the first alloy composition, and the third alloy composition has a band gap that is at least 0.5 eV smaller than the wide band gap.

In furtherance of the first embodiments, the impurity doping is n-type with an impurity dopant concentration of at least $10^{16}$ cm$^{-3}$. The first alloy composition comprises an alloy of InGaAs or GaAsSb. The first alloy composition has an In or Sb content that is at least twice that of the second alloy composition. The third alloy composition has an In or Sb content that is at least 1.5 times that of the first alloy composition.

In furtherance of the first embodiments immediately above, the first alloy composition comprises $In_xGa_{1-x}As$, and x is at least 0.4, the second alloy composition comprises $In_xGa_{1-x}As$, and x is no more than 0.15, and the third alloy composition comprises $In_xGa_{1-x}As$, and x is at least 0.8.

In furtherance of the first embodiments above, the first alloy composition comprises $In_xGa_{1-x}As$, and x is approximately 0.53, the second alloy composition comprises $In_xGa_{1-x}As$, and x is approximately 0.10, and the third alloy composition comprises $In_xGa_{1-x}As$, and x is at least 0.9.

In furtherance of the first embodiments, the first distance is less than 3 nm; and the second distance is less than 10 nm.

In furtherance of the first embodiments, the source and drain regions are laterally spaced apart from opposite sidewalls of the gate stack by an intervening gate sidewall spacer, the first distance is disposed below the gate stack or below the gate sidewall spacer.

In furtherance of the first embodiments, the first III-V semiconductor material is disposed over a sub-fin comprising a III-V compound semiconductor having a different composition than the first alloy composition, and the source and drain regions are disposed over the sub-fin, the compositionally graded alloy having the first III-V composition proximal to an interface with the sub-fin.

In furtherance of the first embodiments immediately above, the graded alloy has the first alloy composition proximate to an interface with the channel region, and the graded alloy has the first alloy composition at a heterojunction with the sub-fin.

In furtherance of the first embodiments, the substrate is monocrystalline silicon, the semiconductor channel region and source/drain regions are monocrystalline, the gate sidewall spacer comprises a high-K gate insulator of the gate stack, and the gate stack comprises a metal gate electrode.

In one or more second embodiments, a CMOS integrated circuit (IC) comprises a silicon substrate, an n-type III-V-channeled fin field effect transistor (FET) disposed over a first region of the substrate, and a p-type finFET disposed over a second region of the substrate. The III-V n-type finFET further includes a channel region comprising a fin of a ternary III-V semiconductor material having a first alloy composition, a gate stack disposed over the channel region, and a pair of impurity doped n-type semiconductor source/drain regions interfacing opposite ends of the channel region, and comprising a graded alloy of the ternary III-V semiconductor material. The graded alloy varies between the first alloy composition proximal to an interface of the channel region to a second alloy composition a first distance from the interface, the second alloy composition associated with a carrier-blocking conduction band offset. The graded alloy further varies between the second alloy composition proximal to the first distance to a third alloy composition at a second distance from the interface, the third alloy composition associated with a non-blocking conduction band offset.

In furtherance of the second embodiments, the second alloy composition has a band gap that is at least 0.25 eV larger than the band gap of the first alloy composition. The third alloy composition has a band gap that is at least 0.5 eV smaller than the wide band gap. The first distance is less than 3 nm. The second distance is less than 10 nm. The p-type finFET comprises a silicon fin.

In furtherance of the second embodiments, regions of the source and drain having the first alloy composition are disposed below the gate sidewall spacer on opposite ends of the channel region.

In one or more third embodiments, a method of fabricating a III-V fin field effect transistor (FET) comprises forming a fin disposed on a substrate, the fin comprising a ternary III-V semiconductor material having a first alloy composition. The method comprises forming a mask over a channel region of the fin. The method comprises recess etching a portion of the first III-V semiconductor material not covered by the mask to expose ends of the fin channel region. The method comprises epitaxially growing impurity-doped III-V source/drain semiconductor on ends of the fin channel region, the growing comprising grading the source/drain semiconductor composition from the first alloy composition to a second alloy composition over a first film thickness, and grading the source/drain semiconductor composition from the second alloy composition to a third alloy composition over a second film thickness, wherein material with the second alloy composition is associated with a carrier-blocking band offset from material with the first alloy composition. The method comprises depositing metal contacts on the impurity-doped III-V source/drain semiconductor.

In furtherance of the third embodiments, the second alloy composition has a wider band gap than the first alloy composition, and the first alloy composition has a wider band gap than the third alloy composition.

In furtherance of the third embodiments, epitaxially growing the impurity-doped III-V source/drain semiconductor further comprises epitaxially growing monocrystalline InGaAs on ends of the fin channel region, and epitaxially growing monocrystalline InAs on the InGaAs.

In furtherance of the third embodiments, recess etching a portion of the first III-V semiconductor material further comprises undercutting a portion of the mask by at least the first thickness.

In furtherance of the third embodiments, epitaxially growing the first thickness further comprises growing the second III-V semiconductor material to a thickness of less than 3 nm.

In furtherance of the third embodiments, recess etching the first III-V semiconductor material exposes a surface of a sub-fin disposed below the fin, the sub-fin further comprising a III-V semiconductor material having a different composition than the first alloy composition, and the method further comprises epitaxially growing the impurity-doped III-V source/drain semiconductor on an exposed sub-fin surface.

In furtherance of the third embodiments, forming the mask over the channel region further comprises depositing a sacrificial gate stack, patterning the sacrificial gate stack into a stripe extending over the channel region, and forming a dielectric gate sidewall spacer adjacent to sidewalls of the sacrificial gate stack stripe. Recess etching a portion of the first III-V semiconductor material further comprises undercutting a portion of the gate stack sidewall spacer by at least the first thickness.

In furtherance of the third embodiments, the method further comprises removing the channel region masking, forming a gate stack over the channel region, the gate stack comprising a gate insulator with a bulk dielectric constant of at least 9 and a metal gate electrode, and wherein depositing the metal contacts further comprises depositing Ti or TiN.

In furtherance of the third embodiments, the first alloy composition comprises $In_xGa_{1-x}As$, and x is approximately 0.53, the second alloy composition comprises $In_xGa_{1-x}As$, and x is approximately 0.10, the third alloy composition comprises $In_xGa_{1-x}As$, and x is at least 0.9. the first distance is less than 3 nm, and the second distance is less than 10 nm.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A monolithic high mobility field effect transistor, comprising:
   a gate electrode over a channel region comprising a first III-V semiconductor material of a first alloy composition; and
   a pair of semiconductor source/drain regions impurity doped to a same conductivity type and interfacing the channel region, the source/drain regions comprising a compositionally graded III-V semiconductor alloy varying between:
      the first alloy composition proximal to an interface of the channel region and a second alloy composition a first distance from the interface, wherein material with the second alloy composition has a charge carrier-blocking band offset from material with the first alloy composition; and
      the second alloy composition and a third alloy composition at a second distance from the interface, material with the third alloy composition having a non-blocking band offset from material with the second alloy composition.

2. The transistor of claim 1, wherein:
   the second alloy composition has a band gap that is at least 0.25 eV larger than the band gap of the first alloy composition; and
   the third alloy composition has a band gap that is at least 0.5 eV smaller than the wide band gap.

3. The transistor of claim 1, wherein:
   the impurity doping is n-type with an impurity dopant concentration of at least $10^{16}$ cm$^{-3}$;
   the first alloy composition comprises an alloy of InGaAs or GaAsSb;
   the first alloy composition has an In or Sb content that is at least twice that of the second alloy composition; and
   the third alloy composition has an In or Sb content that is at least 1.5 times that of the first alloy composition.

4. The transistor of claim 1, wherein:
   the first alloy composition comprises $In_xGa_{1-x}As$, and x is at least 0.4;
   the second alloy composition comprises $In_xGa_{1-x}As$, and x is no more than 0.15; and
   the third alloy composition comprises $In_xGa_{1-x}As$, and x is at least 0.8.

5. The transistor of claim 4, wherein:
   the first alloy composition comprises $In_xGa_{1-x}As$, and x is approximately 0.53;
   the second alloy composition comprises $In_xGa_{1-x}As$, and x is approximately 0.10; and
   the third alloy composition comprises $In_xGa_{1-x}As$, and x is at least 0.9.

6. The transistor of claim 1, wherein:
   the first distance is less than 3 nm; and
   the second distance is less than 10 nm.

7. The transistor of claim 1, wherein:
   the source and drain regions are laterally spaced apart from opposite sidewalls of the gate electrode by an intervening gate sidewall spacer; and
   the first distance is below at least one of the gate electrode or the gate sidewall spacer.

8. The transistor of claim 3, wherein:
   the first III-V semiconductor material is over a sub-fin comprising a III-V compound semiconductor having a different composition than the first alloy composition; and
   the source and drain regions are over the sub-fin, the compositionally graded alloy having the first III-V composition proximal to an interface with the sub-fin.

9. The transistor of claim 8, wherein:
   the graded alloy has the first alloy composition proximate to an interface with the channel region; and
   the graded alloy has the first alloy composition at a heterojunction with the sub-fin.

10. The transistor of claim 1, wherein:
the substrate is monocrystalline silicon;
the semiconductor channel region and source/drain regions are monocrystalline;
the gate sidewall spacer comprises a high-K gate insulator between the gate electrode and channel region; and
the gate electrode comprises a metal gate electrode.

11. A CMOS integrated circuit (IC), comprising:
a silicon substrate;
an n-type III-V-channeled fin field effect transistor (FET) over a first region of the substrate, the n-type III-V finFET further including:
   a channel region comprising a fin of a ternary III-V semiconductor material having a first alloy composition;
   a gate electrode disposed over the channel region; and
   a pair of impurity doped n-type semiconductor source/drain regions interfacing opposite ends of the channel region, and comprising a graded alloy of the ternary III-V semiconductor material, wherein the graded alloy varies between:
      the first alloy composition proximal to an interface of the channel region to a second alloy composition a first distance from the interface, the second alloy composition associated with a carrier-blocking conduction band offset; and
      the second alloy composition proximal to the first distance to a third alloy composition at a second distance from the interface, the third alloy composition associated with a non-blocking conduction band offset; and a p-type finFET disposed over a second region of the substrate.

12. The CMOS IC of claim 11, wherein:

the second alloy composition has a band gap that is at least 0.25 eV larger than the band gap of the first alloy composition;

the third alloy composition has a band gap that is at least 0.5 eV smaller than the wide band gap;

the first distance is less than 3 nm;

the second distance is less than 10 nm and the p-type finFET comprises a silicon fin.

13. The CMOS IC of claim 12, wherein:

regions of the source and drain having the first alloy composition are below a gate sidewall spacer on opposite ends of the channel region.

\* \* \* \* \*